US011289256B2

United States Patent
Testa et al.

(10) Patent No.: US 11,289,256 B2
(45) Date of Patent: Mar. 29, 2022

(54) COIL ACTUATOR FOR LOW AND MEDIUM VOLTAGE APPLICATIONS

(71) Applicant: ABB Schweiz AG, Baden (CH)

(72) Inventors: Marco Testa, Romano di Lombardia (IT); Roberto Usai, Treviolo (IT)

(73) Assignee: ABB Schweiz AG, Baden (CH)

( * ) Notice: Subject to any disclaimer, the term of this patent is extended or adjusted under 35 U.S.C. 154(b) by 245 days.

(21) Appl. No.: 16/585,135

(22) Filed: Sep. 27, 2019

(65) Prior Publication Data

US 2020/0105448 A1 Apr. 2, 2020

(30) Foreign Application Priority Data

Sep. 27, 2018 (EP) .................................... 18197084

(51) Int. Cl.
*H01F 7/06* (2006.01)
*H01F 7/08* (2006.01)
(Continued)

(52) U.S. Cl.
CPC .............. *H01F 7/064* (2013.01); *H01F 7/081* (2013.01); *H01F 7/1844* (2013.01); *H01H 47/325* (2013.01); *H03K 7/08* (2013.01)

(58) Field of Classification Search
CPC ........ H01F 7/064; H01F 7/081; H01F 7/1844; H01F 7/06; H01F 7/18; H01H 47/325; H01H 47/00; H01H 47/32; H03K 7/08
(Continued)

(56) References Cited

U.S. PATENT DOCUMENTS

2010/0027183 A1* 2/2010 Di Maio ............... H01F 7/1844
                                                       361/160
2017/0263366 A1* 9/2017 Pessina .................... H01F 7/18

FOREIGN PATENT DOCUMENTS

EP          2690923 A1     1/2014
EP          2149890 B1    12/2014
EP          3220406 A1     9/2017

OTHER PUBLICATIONS

European Patent Office, Extended Search Report issued in corresponding Application No. 18197084.9, dated Mar. 29, 2019, 7 pp.

* cited by examiner

*Primary Examiner* — Scott Bauer
*Assistant Examiner* — Sreeya Sreevatsa
(74) *Attorney, Agent, or Firm* — Greenberg Traurig, LLP

(57) ABSTRACT

A coil actuator for low and medium voltage applications including: a coil electromagnet having a single coil winding and a movable member; and a power and control unit including: a power circuit operatively coupled with the coil electromagnet, the power circuit including input terminals for receiving an input voltage and an intermediate node, the electromagnet being electrically connected with the input terminal and the intermediate node, the power circuit further including a discharge circuit, which is electrically connected with the first input terminal and the intermediate node in parallel with the coil winding, and a switch circuit, which is electrically connected with the intermediate node and the second input terminal, the switch circuit including at least a power switch; a controller operatively coupled with the power circuit to drive the at least a power switch to control of an input current circulating through the power circuit, the controller being adapted to perform a PWM control of the input current to operate the coil electromagnet; a power supply circuit adapted to feed the controller. The power (Continued)

supply circuit is electrically connected with the intermediate node and the controller.

20 Claims, 5 Drawing Sheets

(51) Int. Cl.
*H01F 7/18* (2006.01)
*H01H 47/32* (2006.01)
*H03K 7/08* (2006.01)

(58) Field of Classification Search
USPC .................................................. 361/152, 160
See application file for complete search history.

COIL ACTUATOR FOR LOW AND MEDIUM VOLTAGE APPLICATIONS

The present invention relates to a coil actuator for low and medium voltage applications. For the purposes of the present application, the term "low voltage" is referred to operating voltages lower than 1 kV AC whereas the term "medium voltage" is referred to operating voltages higher than 1 kV AC up to some tens of kV, e.g. 72 kV AC.

Coil actuators are frequently used in medium and low voltage apparatuses, for instance in low or medium voltage circuit breakers, disconnectors, contactors, for a wide variety of applications. As an example, these devices are widely used to release or lock mechanical parts of spring-actuated circuit breakers, following an opening or closing command.

As is known, most traditional coil actuators normally comprise an electromagnet provided with a pair of distinct windings and a driving electronics capable of selectively energizing said windings to move the member of the coil electromagnet from a rest position to an actuated position (launch maneuver) or maintain said member in said actuated position (hold maneuver) or to allow the return of said member in said rest position.

Recently, coil actuators having a coil electromagnet provided with a single coil winding (hereinafter referred to as "single coil actuators") have been developed. An example of these coil actuators is described in EP2149890B1.

Single coil actuators are normally provided with a more performant driving electronics capable of selectively controlling the excitation current circulating in the coil electromagnet according to different predefined levels to move the member according to the needs.

Currently available single coil actuators can be easily adapted to a wide number of intended applications and they can cover broad operational ranges in terms of voltages and currents. For these reasons, they are widely and satisfactorily used. However, they have still some aspects to improve.

As is known, a single coil actuator may be operatively coupled with a supervisor relay capable of carrying out supervision tests to detect possible failures in the coil electromagnet. Such supervision tests generally include electrical continuity checks aimed at determining whether the single coil winding is interrupted for any reasons.

In order to carry out an electrical continuity check, the supervisor relay provides a test voltage to the coil electromagnet when this latter is a rest condition (i.e. no launch or hold maneuvers are carried out). The supervisor relay suitably checks whether a corresponding suitable test current is present at the input terminals of the driving electronics. Basing on said check, the supervisor relay determines whether the single coil winding is intact or the coil electromagnet is subject to a failure. The experience has shown how such electrical continuity checks show relatively poor reliability levels as they do not often allow correctly determining the presence of interruptions in the single coil winding.

Laboratory and on the field tests have proven that this inconvenience is generally due to the fact that the power supply circuit of the driving electronics provides undesired conductive paths in parallel to the coil winding. Undesired currents having a magnitude comparable with the requested test current may therefore circulate even if the single coil winding is interrupted for some reasons. Of course, this may lead to wrong determinations on the operating status of the coil electromagnet by the supervisor relay.

As it is easy to understand, the above-mentioned drawbacks of currently available single coil actuators adversely affect the reliability of the low or medium voltage apparatus, in which these devices are installed and used.

In the state of the art, it is therefore quite felt the need for technical solutions capable of overcoming the technical issues described above.

The present invention intends to respond to such a need by providing a coil actuator for low and medium voltage applications according to the following claim 1 and related dependent claims.

In a general definition, the coil actuator, according to the invention, comprises a coil electromagnet having a single coil winding and a movable member and a power and control unit.

The power and control unit comprises:
  a power circuit operatively coupled with said coil electromagnet, said power circuit comprising input terminals for receiving an input voltage during a maneuver of said coil electromagnet and an intermediate node arranged in such a way that said electromagnet is electrically connected with said input terminal and said intermediate node. Said power circuit further comprises a discharge circuit, which is electrically connected with said first input terminal and said intermediate node in parallel with said coil winding, and a switch circuit, which is electrically connected with said intermediate node and said second input terminal, said switch circuit comprising at least a power switch.

The power and control unit comprises a controller operatively coupled with said power circuit to drive said power switch. Said controller is adapted to perform a PWM control of an input current circulating through said power circuit to carry out a maneuver of said coil electromagnet.

The power and control unit comprises a power supply circuit including storage means adapted to store electric energy to feed said controller. Said power supply circuit is electrically connected with said intermediate node and said controller. Said power supply circuit is adapted to receive a charging current to charge said storage means, when said power switch is in an interdiction condition.

According to an aspect of the invention, when a maneuver of the coil electromagnet is carried out, said controller executes a control procedure to allow said storage means to be charged during the execution of said maneuver.

Preferably, said control procedure comprises measuring a supply voltage provided by said power supply circuit, said supply voltage being indicative of electric energy stored by said power supply circuit to feed said controller.

Preferably, said control procedure comprises comparing the measured supply voltage with predefined threshold values.

Preferably, said control procedure comprises stopping to perform the PWM control of said input current and commanding said power switch to take an interdiction condition, if the measured supply voltage is lower than a first threshold value.

Preferably, following the stop of the PWM control of said input current, said control procedure comprises starting again to perform the PWM control of said input current, when the measured supply voltage exceeds a second threshold value higher than said first threshold value.

According to an aspect of the invention, said power supply circuit comprises a first output terminal, at which said power supply circuit provides a first supply voltage to said controller. Said power supply circuit comprises a storage circuit electrically connected with said first output terminal. Said storage circuit includes said storage means.

According to an aspect of the invention, said power supply circuit comprises a blocking circuit adapted to allow the circulation of charging currents directed from said intermediate node towards said storage means and adapted to block the circulation of discharging currents directed from said storage means to said intermediate node.

According to an aspect of the invention, said power supply circuit comprises a further intermediate node arranged in such a way that that said blocking circuit is electrically connected with said intermediate node and said further intermediate node. Said power supply circuit comprises a first voltage regulation circuit electrically connected with said further intermediate node and said first output terminal.

According to an aspect of the invention, said power supply circuit comprises a second output terminal, at which said power supply circuit provides a second supply voltage to said controller, said second supply voltage being lower than said first power supply voltage.

According to an aspect of the invention, said power supply circuit comprises a second voltage regulation circuit electrically connected with said first output terminal and said second output terminal.

In a further aspect, the present invention relate to a low or medium voltage apparatus according to claim 12.

Characteristics and advantages of the present invention will emerge from the description of preferred, but not exclusive, embodiments of the coil actuator, according to the invention, nonlimiting examples of which are provided in the attached drawings, wherein.

Figure 4:
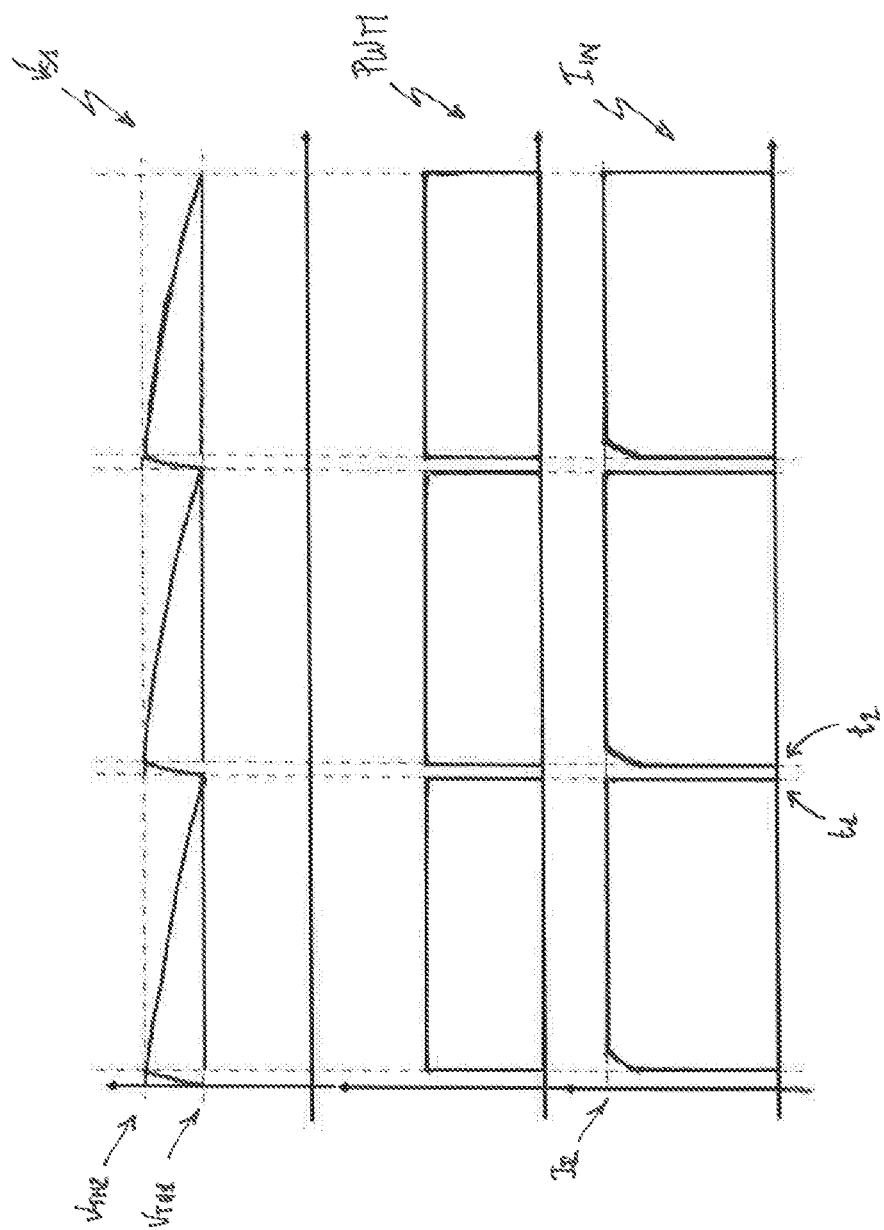
Figure 5:
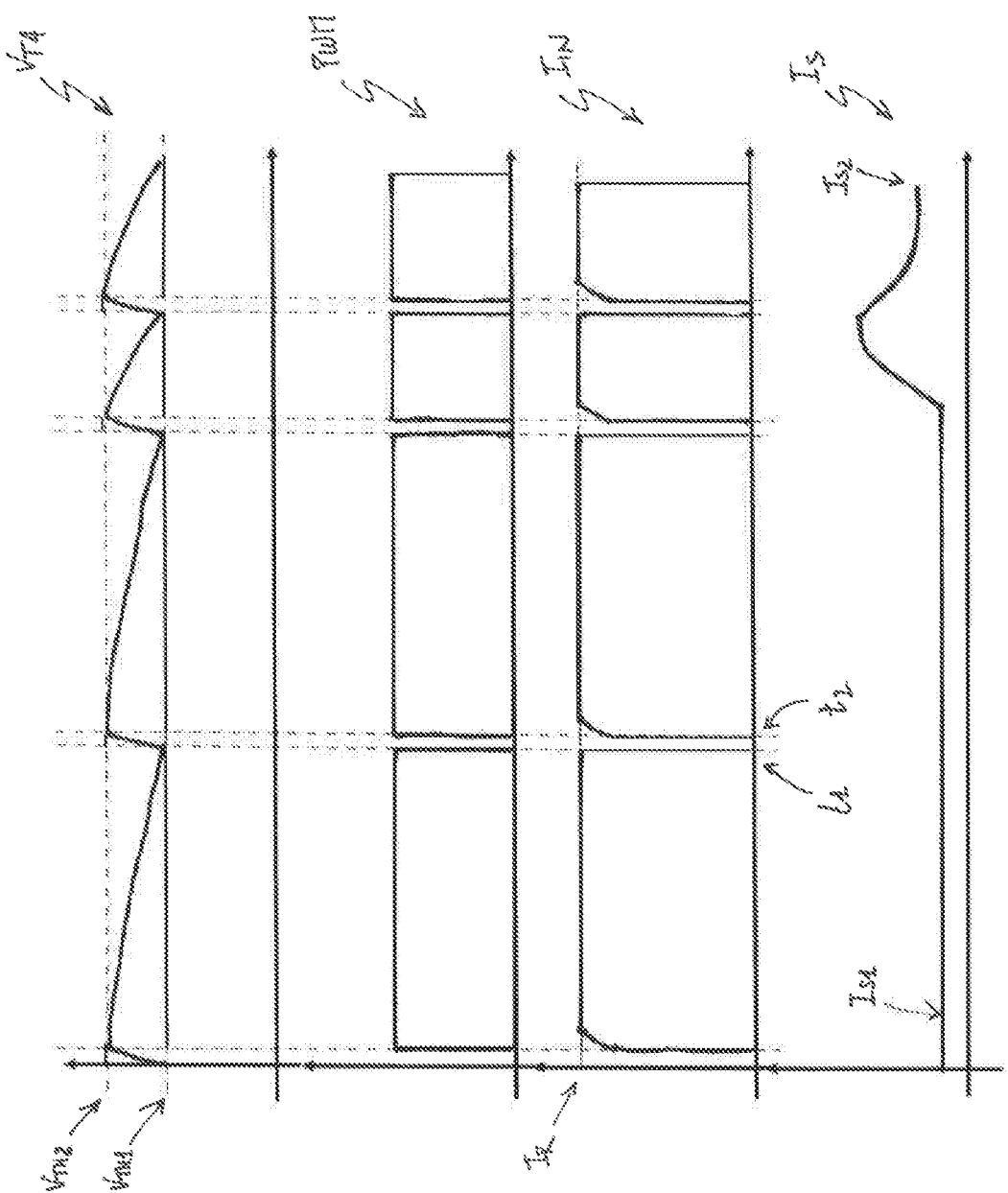

FIGS. 4-5 schematically show examples of operation of the coil actuator according to the invention.

With reference to the cited figures, the present invention relates to a coil actuator 1 for low and medium voltage applications.

The coil actuator 1 is intended to be installed in low or medium voltage apparatuses, such as low or medium voltage circuit breakers, disconnectors, contactors, and the like.

In general, the coil actuator 1 comprises a casing (not shown) defining a volume in which the internal components are accommodated.

According to the invention, the coil actuator 1 comprises a coil electromagnet 2 provided with a single coil winding 21 and a movable member 22.

The movable member 22 can be conveniently moved between a rest position and a launch position upon the application of an actuation force.

The movable member 22 is moved from the rest position to the launch position (launch maneuver) by a magnetic force due to a magnetic flux enchained with the movable member and generated by an excitation current IE circulating along the coil electromagnet 2, more precisely along the single winding 21 of this latter.

Preferably, the movable member 22 is moved from the launch position to the rest position by mechanical means (not shown) included in the coil electromagnet 2, e.g. a spring suitably charged during the launch maneuver of the coil electromagnet.

Preferably, the movable member 22 cannot stably maintain the above-mentioned launch position. To maintain this condition, an excitation current $I_E$ has still to circulate along the coil electromagnet 2 (hold maneuver). Once the excitation current $I_E$ is interrupted or sufficiently reduced, the movable member 22 returns in the rest position due to the opposing force exerted by the above-mentioned mechanical means.

Conveniently, when the coil actuator I is installed in a low or medium voltage apparatus, the movable member 22 is operatively coupled with a kinematic mechanism. As an example, when the coil actuator 1 is installed in a medium voltage circuit breaker, the movable member 22 may be operatively coupled with the primary command chain of said circuit breaker.

According to the invention, the coil actuator 1 comprises a power and control unit 3 operatively coupled with the coil electromagnet 2 to suitably control the operation of this latter.

The power and control unit 3 comprises a power circuit 4.

The power circuit 4 is adapted to receive an input voltage $V_{IN}$ to carry out a maneuver of the electromagnet 2, e.g. a launch maneuver or a hold maneuver of this latter.

The power circuit 4 is operatively coupled with the coil electromagnet 2 to drive this latter upon receiving the input voltage $V_{IN}$. In this way, when the power circuit 4 is fed with the input voltage $V_{IN}$, the coil electromagnet 2 may receive a suitable excitation current $I_E$ to carry out the desired maneuver.

Preferably, the input voltage $V_{IN}$ has a DC waveform. More preferably, the input voltage $V_{IN}$ has a rectified full-wave sinusoidal waveform having a given operating frequency (e.g. 50 Hz). However, in principle, the input voltage $V_{IN}$ may have different waveforms, such as a rectified half-wave sinusoidal waveform, a pulsed waveform or a continuous waveform.

Preferably, the power and control unit 3 comprises first sensing means 5 (e.g. a resistive divider) adapted to provide first detection signals SI indicative of a behavior of the input voltage $V_{IN}$ received by the power circuit 4.

The power circuit 4 comprises a first input terminal T1 and a second input terminal T2, at which it receives the input voltage $V_{IN}$ and, possibly, an input current $I_{IN}$ circulating between the terminals TI and T2, during the execution of a maneuver of the switching device 2.

The power circuit 4 comprises an intermediate electric node T3 so that the coil electromagnet 2 is electrically connected with the first input terminal T1 and said intermediate electric node. The power circuit 4 comprises a switch circuit 41 and a discharge circuit 42 operatively coupled with the coil electromagnet 2 at the intermediate electric node T3.

The discharge circuit 42 is electrically connected with the first input terminal T1 and the intermediate electric node T3, in such a way to be electrically connected in parallel with the electromagnet 2.

The discharge circuit 42 is adapted to allow the equivalent inductance formed by the electromagnet 2 to discharge when said coil electromagnet is not fed by an excitation current $I_E$. To this aim, the discharge circuit 42 is suitably arranged to allow the circulation of a discharge current Io when the power circuit 4 is not fed by an input current $I_{IN}$.

Preferably, the discharge circuit 42 comprises a free-wheeling diode 420 (which may be of conventional type) having its anode and cathode electrically connected respectively with the electric node T3 and the first input terminal T1.

The switch circuit 41 is electrically connected in series with the parallel group formed by the discharge circuit 42 and the coil electromagnet 2.

More precisely, the switch circuit 41 is electrically connected with the intermediate electric node T3 and the second input terminal T2.

The switch circuit 41 is adapted to allow or prevent the input current $I_{IN}$ to circulate through the power circuit 4 between the terminals T1 and T2, when the input voltage $V_{IN}$ is applied at said input terminals to carry out maneuver of the switching device 2.

The switch circuit 41 comprises at least a power switch 410, preferably a single power switch as shown in the cited figures.

The power switch 410 may be of conventional type, for example a power MOSFET or BJT. Preferably, the power switch 410 has its drain or collector terminal and its source or emitter terminal electrically connected with the intermediate electric node T3 and the second input terminal T2, respectively.

The power switch 410 is conveniently adapted to switch between a conduction state and an interdiction state.

During the execution of a maneuver of the switching device 2, the switching frequency of the power switch 410 is normally very higher than the operating frequency of the electric quantities characterizing the power circuit 4. As an example, the switching frequency of said power switch may be 10 kHz whereas the input voltage $V_{IN}$ may have an operating frequency of some tens of Hz.

During the execution of a maneuver of the switching device 2, when the power switch 410 is in a conduction state, the input current $I_{IN}$ is allowed to circulate through the power circuit 4 and the electromagnet 2 by passing through said power switch and the input terminals T1, T2. In this case, the equivalent inductance formed by the electromagnet 2 is charged by an excitation current $I_E$. Additionally, the free-wheeling diode 420 is in an interdiction state and no currents will circulate through it (with the exception of small leakage currents). Instead, when the power switch 410 is in an interdiction state, the input current $I_{IN}$ is interrupted. In this case, the freewheeling diode 420 is in a conduction state and a discharge current ID circulates through the discharge circuit 42, thereby causing the discharge of the equivalent inductance formed by the electromagnet 2.

Preferably, the power and control unit 3 comprises second sensing means 7 (e.g. a resistive shunt) adapted to provide second detection signals S2 indicative of a behavior of the input current $I_{IN}$ circulating along the power circuit 4 between the input terminals T1 and T2.

Figure 1:
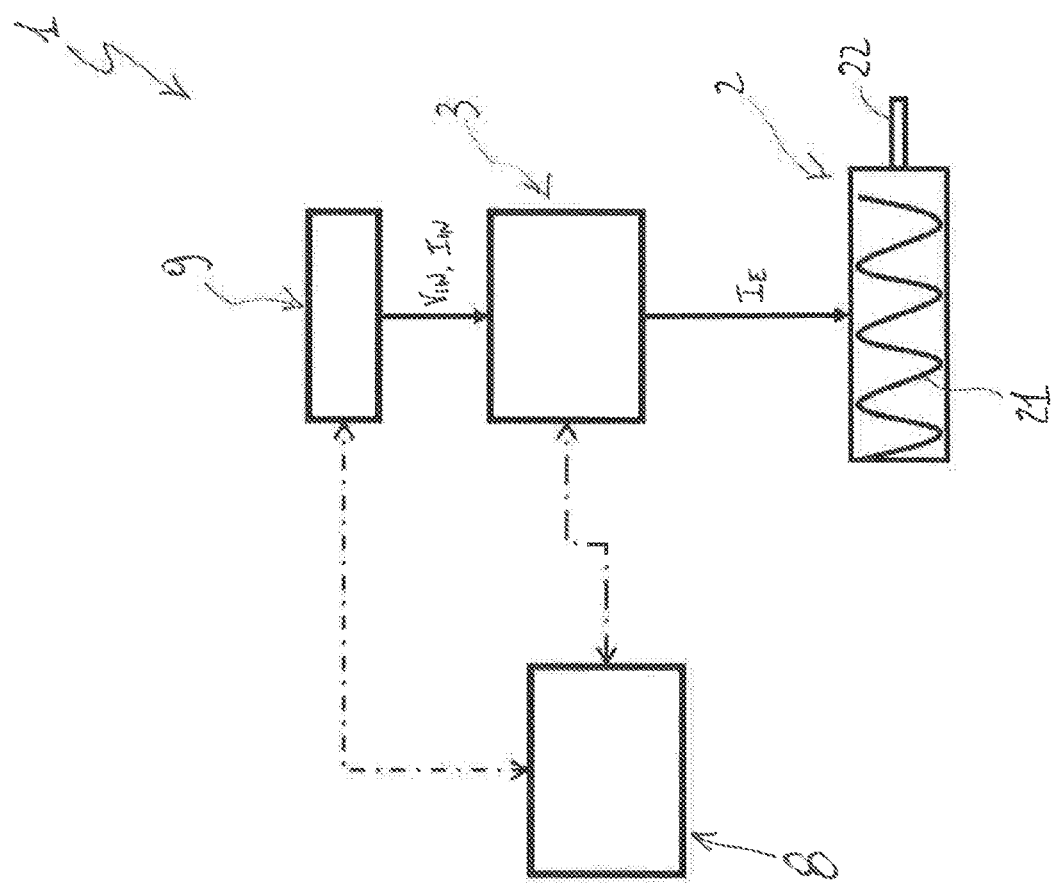
FIG. 1 is a schematic view of a coil actuator according to the invention.
Figure 2:
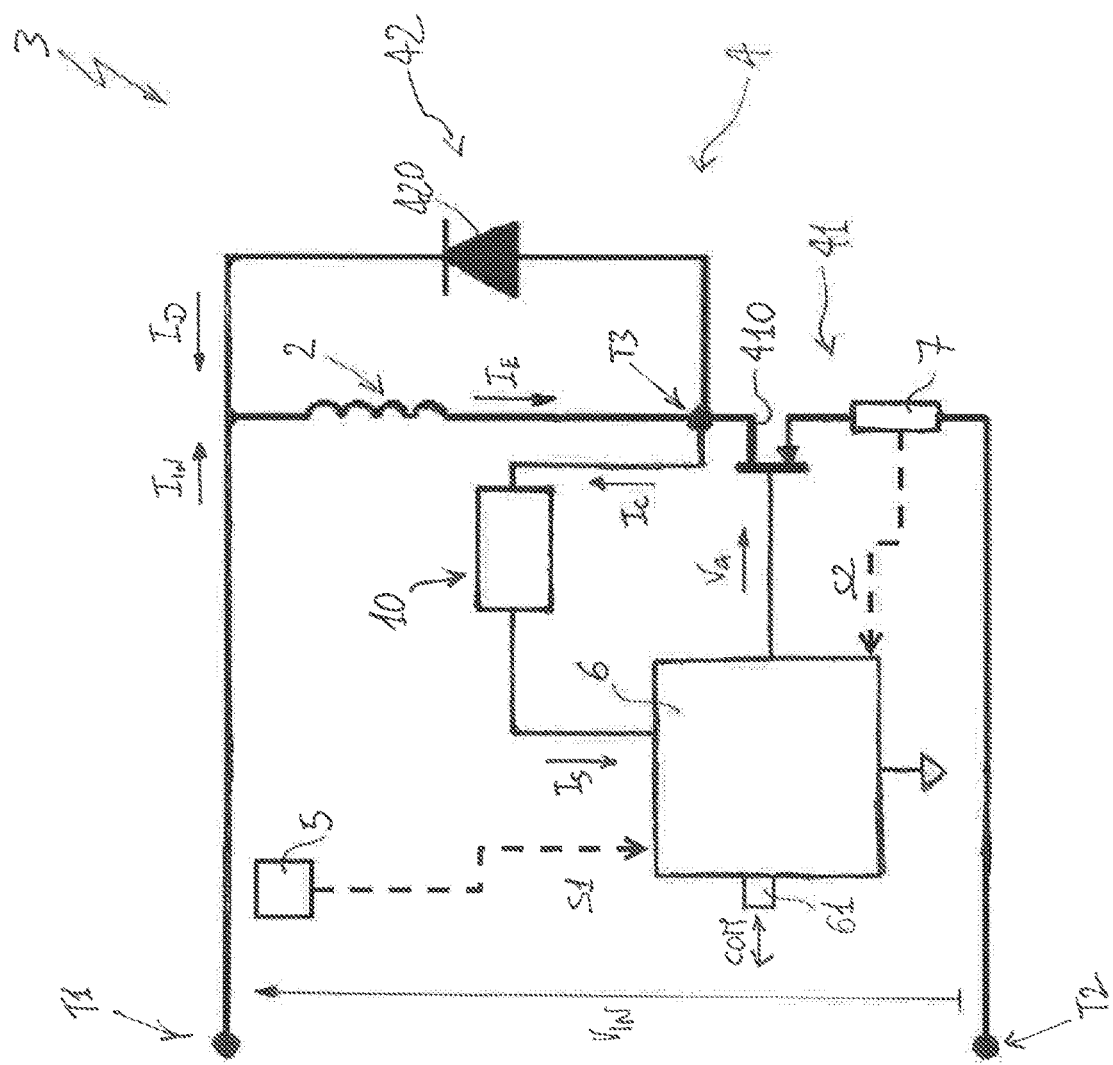
FIG. 2 is a schematic view of a power and control unit included in the coil actuator according to the invention.

According to some embodiments (as shown in FIG. 2), the switch circuit 41 may include the above-mentioned second sensing means 7. In this case, the second sensing means 7 may be formed a resistive shunt electrically connected in series with the power switch 410 and the input terminal T2 of the power circuit 4.

According to the invention, the power and control unit 3 comprises a controller 6.

The controller 6 is operatively coupled with the switch circuit 41 to drive the power switch 410. Preferably, the controller 6 is adapted to control the operation of the power switch 410 by conveniently providing control signals VG (e.g. voltage signals of the pulsed type) to the gate or base terminal of such a power switch.

Preferably, the controller 6 is operatively coupled with the first sensing means 5 and possibly, with the second sensing means 7 in order to receive and process the first detection signals S1 and, possibly, the second detection signals S2 in order to control the operation of the power switch 410. During the execution of a maneuver of the switching device 2, the controller 6 is adapted to carry out a PWM control of the input current $I_{IN}$ by suitably driving the power switch 410, preferably by controlling a switching duty-cycle of the power switch 410.

In this way, the controller 6 is capable of controlling an average value of the input current $I_{IN}$ (in a time interval very longer than the switching period of the power switch 410, such as a period of the input voltage $V_{IN}$) in such a way to make this latter to follow a given reference value set for said input current.

In practice, the controller 6 compares the measured average values of the input current $I_{IN}$ (provided by the second detection signals S2 sent by the second sensing means 7) with the set reference value $I_R$ and varies a duty-cycle value of the power switch 410 on the base of an error value obtained from such a comparison.

Obviously, an increase or decrease of the duty-cycle value D of the power switch 410 will determine a corresponding increase or decrease of the average value of the input current respectively.

The PWM control algorithms carried out by the controller 6 may be of known type and they will be hereinafter described only for the aspects relevant to the invention, for the sake of brevity.

The controller 6 carries out the above-mentioned PWM control of the input current $I_{IN}$ in order to obtain a selected operating level for a excitation current $I_E$ circulating along the single winding 21 of the electromagnet 2. In particular, the above-mentioned PWM control of the input current $I_{IN}$ is aimed at obtaining an average operating level of the excitation current $I_E$ for a corresponding time interval, which may be in the order of hundreds of ms, e.g. equal to some tens of time periods of the input voltage $V_{IN}$ (when this latter is a periodic signal).

In order to carry out a desired maneuver, the electromagnet 2 (more precisely along the winding 21 of this latter) has to be fed with an excitation current $I_E$ having such an average operating level, which may be a predetermined launch level, when a launch maneuver of the electromagnet 2 needs to be carried out, or a predetermined hold level, when a hold maneuver of the electromagnet 2 needs to be carried out.

In principle, however, the power circuit 4 may receive in input voltages of different type with respect to the above mentioned input voltage $V_{IN}$, in particular voltages that are not necessarily directed to carry out a maneuver of the electromagnet 2.

In some cases, the controller 6 may still drive the power switch 410 to carry out a PWM control of possible current circulating through the power circuit 4. As an example, when the anchor 22 of the electromagnet 2 is in a rest position, the power circuit 4 may receive in input a test voltage directed to carry out an electric continuity check of the test winding 21. In this case, the controller 6 may drive the power switch 410 to carry out a PWM control of a test current flowing between the input terminals T1 and T2 in such a way that the electromagnet 2 is fed with an excitation current $I_E$ having a given coil supervision level (quite lower than the operating level requested to carry out a launch maneuver) in order to check the integrity of the winding 21.

In other cases, the controller 6 may command the power switch 410 to take a given operating condition, e.g. an interdiction condition or a conduction condition.

The controller 6 may include one or more computerized units (e.g. microprocessors) configured to execute software instructions to carry out the desired functionalities.

In general, the controller 6 may be realized according to solutions of known type and it will be hereinafter described only for the aspects relevant to the invention, for the sake of brevity. Preferably, the coil actuator 1 comprises or is operatively connected with a further control unit 8 (e.g. a supervision relay) adapted to interact with the power and control unit 3, for example with the controller 6.

Preferably, the control unit 8 is adapted to carry out supervision tests to detect possible failures in the coil electromagnet 2.

Such supervision tests conveniently include electrical continuity checks directed to check whether the single coil winding 21 is interrupted for any reasons.

Supervisions tests may be carried out in known manners according to the needs and they will be hereinafter described only for the aspects relevant to the invention, for the sake of brevity. Preferably, the controller 6 comprises a communication port 61 (e.g. a CAN-bus communication port) for communication with the control unit 8. The control unit 8 and the controller 6 may exchange suitable control and/or data signals COM to manage the operation of the coil actuator 1. The control unit 8 may include one or more computerized units (e.g. microprocessors) configured to execute software instructions to carry out the desired functionalities. In general, the control unit 8 may be realized according to solutions of known type and it will be hereinafter described only for the aspects relevant to the invention, for the sake of brevity.

Preferably, the coil actuator 1 comprises or is operatively coupled with a power supply unit 9. The power supply unit 9 is operatively coupled with the power and control unit 3 and, possibly, with the control unit 8, to feed said units.

The power supply unit 9 is adapted to provide an input voltage $V_{IN}$ received by the power circuit 4 of the power and control unit 3 to operate.

Preferably, the power supply stage 9 comprises power supply circuits (not shown) adapted to receive electric power from a power supply source (e.g. an electric line).

Preferably, the power supply stage 9 comprises a filter circuit (e.g. a LC filter—not shown) that may be configured to cut high frequency current components (possibly generated by the controller 6) or other disturbances coming from the power supply source.

Preferably, the power supply stage 9 comprises a rectifier circuit (e.g. a circuit bridge—not shown) to convert a power voltage (e.g. a sinusoidal voltage) provided by the above-mentioned power supply circuit into a suitable input voltage $V_{IN}$ (e.g. a rectified sinusoidal voltage) to be received by the power circuit 4 of the power and control unit 3.

The operation of the power supply stage 9 is conveniently controlled by the further control unit 8, for example with the aim of suitably operating the coil electromagnet 2 or carrying out supervisions tests.

In general, the power supply stage 9 may be realized according to solutions of known type and it will be hereinafter described only for the aspects relevant to the invention, for the sake of brevity. The power and control unit 3 comprises a power supply circuit 10 adapted to feed the controller 6. Conveniently, the power supply circuit 10 comprises storage means 140 (preferably of capacitive type) to store electric energy to feed the controller 6.

According to the invention, the power supply circuit 10 is electrically connected with the intermediate node T3 and the controller 6, so that the power supply circuit 10 can receive electric power from the intermediate node T3 to feed the controller 6.

The power supply circuit 10 is arranged in such a way that it receives electric power at the intermediate node T3 to charge the storage means 140, when the power switch 410 is in an interdiction condition.

In particular, when the power switch 410 is in said interdiction condition, the power supply circuit 10 receives a charging current $I_C$ to charge the storage means 140 aimed at storing electric energy to feed the controller 6. On the other hand, when the power switch 410 is in a conduction condition, the power supply circuit 10 does not receive any charging current and prevents the storage means 140 to be discharged by discharging currents directed towards the intermediate node T3.

The above-described arrangement provides relevant technical advantages.

Thanks to its particular arrangement, when a generic voltage is provided at the input terminals T1 and T2, the power supply circuit 10 cannot receive any current if there is an interruption of the single coil winding 21 of the coil electromagnet 2.

In fact, since the intermediate electric node T3 is arranged between the parallel group formed by the electromagnet 2 and discharge circuit 42 and the switch circuit 41, any possible charging current $I_C$ feeding the power supply circuit 10 must necessarily circulate through the single coil winding 21 of the electromagnet 2 (the power switch 410 is in interdiction state).

In this way, when a test voltage is provided at the input terminals T1 and T2 to check the electrical continuity of the single coil winding 21, the power supply circuit 10 does not offer alternative conductive paths for the circulation of undesired currents (even if the power switch 410 is commanded in an interdiction state).

The presence of a test current at the input terminals T1 and T2 will therefore be indicative of a safe condition of the single coil winding 21. On the other hand, the absence of such a test current $I_{IN}$ at the input terminals T1 and T2 will be indicative of a failure in the electromagnet 2.

According to a preferred embodiment of the invention, when a maneuver of the coil electromagnet 2 (e.g. a launch maneuver or a hold maneuver) is carried out, the controller 6 is adapted to carry out a control procedure of the power switch 410, which is aimed at ensuring that a suitable charging process of the internal storage means 140 of the power supply circuit 10 is carried out.

The above-mentioned control procedure is designed to suitably exploit the input voltage $V_{IN}$, which is necessarily provided at the terminals T1, T2 during a maneuver of the electromagnet 2, to suitably charge the storage means 140 of the power supply circuit 10.

According to the above-mentioned control procedure, during a maneuver of the coil electromagnet 2, the controller 6 continuously measures a supply voltage (e.g. the supply voltage $V_{S1}$) provided by the power supply circuit 10 to the controller 6 itself.

Conveniently, the measured supply voltage $V_{S1}$ is indicative of the level of electric energy stored by internal storage means 140 of the power supply circuit 10.

The measurement of the supply voltage $V_{S1}$ may be carried out in a known manner, e.g. by suitably acquiring and digitally processing subsequent samples of said supply voltage.

According to the above-mentioned control procedure, during a maneuver of the coil electromagnet 2, the controller 6 compares the measured voltage $V_{S1}$ with predefined threshold values $V_{TH1}$ and $V_{TH2}$.

According to the above-mentioned control procedure, when the measured supply voltage $V_{S1}$ becomes lower than a first threshold value $V_{TH1}$, the controller 6 stops carrying out the PWM control of the input current $I_{IN}$ and commands the power switch 410 to take an interdiction condition. In this way, the power supply circuit 10 can receive a charging current $I_C$ to charge the internal storage means 140.

According to the above-mentioned control procedure, following the stop to perform the PWM control of the input current $I_{IN}$, when the measured supply voltage $V_{S1}$ increases and exceeds a second threshold value $V_{TH2}$, which is higher than the first threshold value $V_{TH1}$, the controller 6 starts again carrying out the PWM control of the input current $I_{IN}$ in order to carry out the desired maneuver of the electromagnet 2.

In practice, during a maneuver of the coil electromagnet 2, the above-mentioned control procedure provides for temporarily suspending the PWM control of the input current $I_{IN}$ and operating the power switch 410 to allow the storage means 140 to be charged, when the electric energy stored by the storage means 140 is too low (the measured supply voltage $V_{S1}$ is lower than the threshold value $V_{TH1}$).

When the electric energy stored by the internal storage means 140 is restored at a suitable level (the measured supply voltage $V_{S1}$ is higher than the threshold value $V_{TH2}$), the above-mentioned control procedure provides for resuming the PWM control of the input current $I_{IN}$ in order to carry out the desired maneuver of the electromagnet 2.

It is evidenced that the time intervals, in which the PWM control of the input current $I_{IN}$ is suspended, have a relatively short duration (few ms). Additionally, the charging currents IC absorbed by the power supply circuit 10 to charge the storage means 140 have a magnitude of few mA. The repeated interruptions of the PWM control of the input current $I_{IN}$ have therefore a negligible effect on the operating conditions of the electromagnet 2, which is substantially not affected by the charging of the storage means 140 when a maneuver of said electromagnet 2 is carried out.

In the following, the circuit structure of the power supply circuit 10 is described in more details in accordance with some possible embodiments of the invention.

Preferably, the power supply circuit 10 comprises a first output terminal T4 electrically connected with the controller 6, for example by means of a suitable connection circuit of known type (not shown). At the first output terminal T4, the power supply circuit 10 provides a first supply voltage $V_{S1}$ to the controller 6. The first supply voltage $V_{S1}$ may be conveniently exploit to feed higher power circuitry of the controller 6, for example circuitry of analog type. As an example, the first supply voltage $V_{S1}$ may be about 15V.

Preferably, the power supply circuit 10 comprises a second output terminal T6 electrically connected with the controller 6, for example by means of a suitable connection circuit of known type (not shown). At the second output terminal T6, the power supply circuit 10 provides a second supply voltage $V_{S2}$ to the controller 6, which is conveniently lower than the first supply voltage $V_{S1}$. The second supply voltage $V_{S2}$ may be conveniently exploit to feed suitable lower power circuitry of the controller 6, for example digital processing circuits. As an example, the second supply voltage $V_{S2}$ may be about 3V.

Preferably, the power supply circuit 10 comprises a storage circuit 14 electrically connected with the first output terminal T4 and comprising the storage means 140, which are adapted to store electric energy to feed the controller 6. The storage means 140 may comprise one or more capacitors electrically connected between the output terminal T4 and a ground reference.

Preferably, the power supply circuit 10 comprises a blocking circuit 11 electrically connected with the intermediate node T3. The blocking circuit 11 is conveniently adapted to allow the circulation of a charging current 1e directed from the intermediate node T3 towards the storage means 140 and block the circulation of possible discharging currents directed from the charging means 140 to the intermediate node T3. The blocking circuit 11 may comprise a blocking diode 110 (which may be of conventional type) having its anode and cathode electrically connected respectively with the intermediate electric node T3 and the output terminal T4 or, preferably, an output node TS of said blocking circuit.

Preferably, the power supply circuit 10 comprises a first voltage regulation circuit 12 electrically connected with an output terminal node TS of the blocking circuit 11 and the first output terminal T4. The voltage regulation circuit 12 may comprise a higher voltage to a lower voltage conversion circuit (e.g. including suitably arranged depletion MOSFETs), which may be arranged according to solutions of traditional type.

Preferably, the power supply circuit 10 comprises a second voltage regulation circuit 13 electrically connected with the output terminals T4 and T6. The voltage regulation circuit 13 may comprise a LDO regulator, which may be arranged according to solutions of traditional type.

Figure 3:
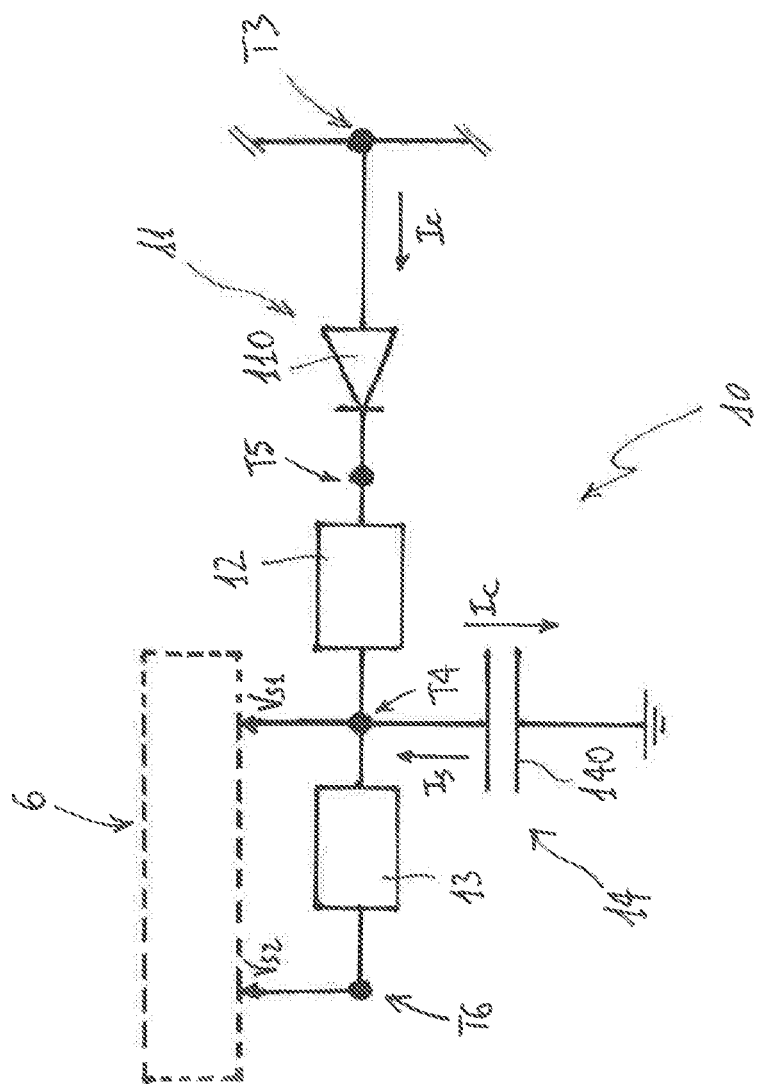
FIG. 3 is a schematic view of a power supply circuit included in the power control unit of FIG. 2.

The specific operation of the power supply circuit 10 in relation to the operating conditions of the power switch 410, during a maneuver of the electromagnet 2, is now described in further details with reference to the embodiment of FIGS. 2-3.

When the power switch 10 is commanded in an interdiction state, the input current $I_{IN}$ is interrupted as no currents circulate at the terminal T2. The intermediate electric node T3 takes a terminal voltage close to the voltage applied at the first terminal T1. Said terminal voltage is higher than the supply voltage $V_{S1}$ provided by the storage means 140. The blocking diode 11 is put in a conduction state. In this case, a charging current $I_C$ can circulate from the intermediate electric node T3 towards the storage means 140 (passing through the input terminal T1 and the electromagnet 2) to charge said storage means.

When the power switch 10 is commanded in a conduction condition, the input current $I_{IN}$ circulates at the terminals T1 and T2. The intermediate electric node T3 takes a voltage lower than the supply voltage $V_{S1}$ provided by the storage means 140. The blocking diode 11 is put in an interdiction state. In this situation, any discharging current circulating from the storage means 140 to the intermediate electric node T3 is blocked by the blocking circuit 11.

The general operation of the controller 6 to manage the charging process of the storage means 140, during a maneuver of the electromagnet 2, is now described in further details with reference to FIGS. 2-5.

As mentioned above, the electromagnet 2 is supposed to be carrying out a maneuver, e.g. a launch maneuver or a hold maneuver.

The controller 6 is supposed to have selected a reference value fa to be used for carrying out the PWM control of the input current $I_{IN}$.

In order to force the input current $I_{IN}$ to follow the reference value $I_R$ and obtain a given operating level for the excitation current $I_E$ circulating in the electromagnet 2 in order to carry out the desired maneuver, the controller 6 drives the power switch 410 to switch between a conduction condition and an interdiction condition with a given duty-cycle value.

While performing the PWM control of the input current $I_{IN}$, the controller 6 continuously measures the supply voltage $V_{S1}$ provided by the power supply circuit 10 and compares said supply voltage $V_{S1}$ with the threshold values $V_{TH1}$, $V_{TH2}$.

The measured supply voltage $V_{S1}$ naturally tends to decrease during a maneuver of the coil electromagnet 2. In fact, while performing the PWM control of the input current $I_{IN}$, the power switch 410 is commanded in a conduction state at each PWM cycle (normally during most of each PWM cycle), which makes the storage means 140 to be discharged on average (i.e. over a time interval very longer than the duration of a PWM cycle).

At the instant $t_1$, the measured supply voltage $V_{S1}$ becomes lower than the first threshold value $V_{TH1}$. This means that the storage means 140 have achieved an unsatisfactory charging level. The controller 6 stops performing the PWM control of the input current $I_{IN}$ and provides control signals VG to command the power switch 410 to take an interdiction state. In this situation, the storage means 140 are charged by a charging current $I_C$ and the measured supply voltage $V_{S1}$ naturally tends to increase.

At the instant $t_2$, the measured supply voltage $V_{S1}$ exceeds the second threshold value $V_{TH2}$. This means that the storage means 140 have restored a satisfactory charging level.

The controller 6 starts again performing the PWM control of the input current $I_{IN}$.

The above-described control procedure is conveniently repeated by the PWM controller 6 during the desired maneuver of the coil electromagnet 2.

FIG. 4 clearly shows how during a maneuver of the electromagnet 2, the above-mentioned control procedure provides for repeatedly suspending the PWM control of the input current $I_{IN}$ for given time intervals $T_C$, during which a charging process of the storage means 140 is carried out. In general, the duration of the time intervals $T_C$ during which the internal storage means 140 are charged depends on physical quantities involved in the charging process and on the setting of the threshold values $V_{TH1}$ and $V_{TH2}$.

However, such a duration is relatively shorter (e.g. about $\frac{1}{10}$) with respect to the duration of the time intervals during which the PWM control of the input current $I_{IN}$ is normally performed by the controller 6.

Due to the relatively small power absorbed during the time intervals $T_C$, the repeated interruptions of the PWM control of the input current $I_{IN}$ do not substantially affect the operating conditions of the electromagnet 2.

FIG. 5 shows how the repetition frequency of the time intervals $T_C$ is correlated with the overall supply current Is absorbed by the controller 6.

An increase of the absorbed supply current Is (e.g. from level $I_{S1}$ to level $I_{S2}$) will cause an increase of the repetition frequency of the time intervals $T_C$ whereas a decrease of the absorbed supply current Is will cause a decrease of the repetition frequency of the time intervals $T_C$.

The above-described control procedure of the controller 6 can thus automatically adjust the repetition frequency of the charging process of the storage means 140 to follow possible variations of the overall supply current Is absorbed by the controller 6.

The coil actuator 1, according to the invention, allows achieving the intended aims and objects.

The coil actuator comprises a power and control unit 3 provided with power supply means to feed the PWM controller 6, which are arranged in such a way to not affect possible electrical continuity tests carried out to check the integrity of the single coil winding 21.

The present invention therefore solves or mitigates the above-mentioned drawbacks of the state of the art.

The coil actuator 1 shows higher levels of reliability with respect to solutions currently available solutions of the state of the art.

The coil actuator 1 is provided with a power and control unit 3 having a compact design and capable of properly driving the electromagnet 2 when a maneuver of this latter has to be carried out.

The coil actuator 1 can be easily manufactured at industrial level at competitive costs with respect to currently available devices of the same type.

The invention claimed is:

1. A coil actuator for low and medium voltage applications comprising:
   a coil electromagnet having a single coil winding and a movable member; and
   a power and control unit comprising:
      a power circuit operatively coupled with said coil electromagnet, said power circuit comprising a first input terminal and a second input terminal, for receiving an input voltage during a maneuver of said coil electromagnet and an intermediate node so that said coil electromagnet is electrically connected between said first input terminal and said intermediate node, said power circuit further comprising a discharge circuit, which is electrically connected between said first input terminal and said intermediate node in parallel with said coil electromagnet, and a switch circuit, which is electrically connected between said intermediate node and said second input terminal, said switch circuit comprising a power switch;
      a controller operatively coupled with said power circuit to drive said power switch, said controller being adapted to perform a pulse width modulated (PWM) control of an input current circulating through said power circuit to carry out a maneuver of said coil electromagnet;
   wherein said power and control unit comprises a power supply circuit including storage means adapted to store electric energy to feed said controller, said power supply circuit being electrically connected between said intermediate node and said controller, said power supply circuit receiving a charging current to charge said storage means, when said power switch is in an interdiction condition.

2. The coil actuator, according to claim 1, wherein when a maneuver of the coil electromagnet is carried out, said controller executes a control procedure to allow said storage means to be charged during the execution of said maneuver.

3. The coil actuator, according to claim 2, wherein said control procedure comprises measuring a supply voltage provided by said power supply circuit, said supply voltage being indicative of electric energy stored by said power supply circuit to feed said controller.

4. The coil actuator, according to claim 3, wherein said control procedure comprises comparing the measured supply voltage with predefined threshold values.

5. The coil actuator, according to claim 4, wherein said control procedure comprises stopping to perform the PWM control of said input current and commanding said power switch to take an interdiction condition, if the measured supply voltage is lower than a first threshold value.

6. The coil actuator, according to claim 5, wherein following the stop of the PWM control of said input current, said control procedure comprises starting again to perform the PWM control of said input current, when the measured supply voltage exceeds a second threshold value higher than said first threshold value.

7. The coil actuator, according to claim 6, wherein said power supply circuit comprises a first output terminal, at which said power supply circuit provides a first supply voltage to said controller, said power supply circuit comprising a storage circuit electrically connected with said first output terminal, said storage circuit including said storage means.

8. The coil actuator, according to claim 7, wherein said power supply circuit comprises a blocking circuit adapted to allow the circulation of charging currents directed from said intermediate node towards said storage means and adapted to block the circulation of discharging currents directed from said storage means to said intermediate node.

9. The coil actuator, according to claim 8, wherein said power supply circuit comprises a further intermediate node, so that said blocking circuit is electrically connected with said intermediate node and said further intermediate node, said power supply circuit comprising a first voltage regulation circuit electrically connected with said further intermediate node and said first output terminal.

10. The coil actuator, according to claim 9, wherein said power supply circuit comprises a second output terminal, at which said power supply circuit provides a second supply voltage to said controller, said second supply voltage being lower than said first power supply voltage.

11. The coil actuator, according to claim 10, wherein said power supply circuit comprises a second voltage regulation circuit electrically connected with said first output terminal and said second output terminal.

12. The coil actuator, according to claim 8, wherein said power supply circuit comprises a second output terminal, which said power supply circuit provides a second supply voltage to said controller, said second supply voltage being lower than said first power supply voltage.

13. The coil actuator, according to claim 12, wherein said power supply circuit comprises a second voltage regulation circuit electrically connected with said first output terminal and said second output terminal.

14. The coil actuator, according to claim 7, wherein said power supply circuit comprises a second output terminal, at which said power supply circuit provides a second supply voltage to said controller, said second supply voltage being lower than said first power supply voltage.

15. The coil actuator, according to claim 14, wherein said power supply circuit comprises a second voltage regulation circuit electrically connected with said first output terminal and said second output terminal.

16. A low or medium voltage apparatus, comprising a coil actuator, according to claim 1.

17. The coil actuator, according to claim 1, wherein said power supply circuit comprises a first output terminal, at which said power supply circuit provides a first supply voltage to said controller, said power supply circuit comprising a storage circuit electrically connected with said first output terminal, said storage circuit including said storage means.

18. The coil actuator, according to claim 17, wherein said power supply circuit comprises a blocking circuit adapted to allow the circulation of charging currents directed from said intermediate node towards said storage means and adapted to block the circulation of discharging currents directed from said storage means to said intermediate node.

19. The coil actuator, according to claim 18, wherein said power supply circuit comprises a further intermediate node, so that said blocking circuit is electrically connected with said intermediate node and said further intermediate node, said power supply circuit comprising a first voltage regulation circuit electrically connected with said further intermediate node and said first output terminal.

20. The coil actuator, according to claim 17, wherein when a maneuver of the coil electromagnet is carried out, said controller executes a control procedure to allow said storage means to be charged during the execution of said maneuver.

* * * * *